US009513325B2

United States Patent
Yoshida et al.

(10) Patent No.: US 9,513,325 B2
(45) Date of Patent: Dec. 6, 2016

(54) MATRIX KEY INPUT INTERFACE

(71) Applicant: FANUC Corporation, Yamanashi (JP)

(72) Inventors: Kouhei Yoshida, Yamanashi (JP); Jiro Kinoshita, Yamanashi (JP); Hiroshige Ando, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 84 days.

(21) Appl. No.: 14/658,374

(22) Filed: Mar. 16, 2015

(65) Prior Publication Data
US 2015/0268286 A1 Sep. 24, 2015

(30) Foreign Application Priority Data

Mar. 24, 2014 (JP) .................. 2014-060389

(51) Int. Cl.
*G06F 3/023* (2006.01)
*G01R 31/02* (2006.01)
*G06F 3/02* (2006.01)
*H03M 11/20* (2006.01)

(52) U.S. Cl.
CPC ............ *G01R 31/02* (2013.01); *G06F 3/0202* (2013.01); *G06F 3/023* (2013.01); *G06F 3/0233* (2013.01); *H03M 11/20* (2013.01)

(58) Field of Classification Search
CPC ........ G01R 31/02; G06F 3/0202; G06F 3/023; G06F 3/0233; H03M 11/20
See application file for complete search history.

(56) References Cited

U.S. PATENT DOCUMENTS

2006/0181195 A1* 8/2006 Oikawa .................. G09G 3/006
313/498

FOREIGN PATENT DOCUMENTS

JP 61-58025 A 3/1986

* cited by examiner

*Primary Examiner* — David Gray
*Assistant Examiner* — Michael Harrison
(74) *Attorney, Agent, or Firm* — Hauptman Ham, LLP

(57) ABSTRACT

A matrix key input interface has key common signal lines and key data signal lines wired in a matrix and key switches disposed at positions where the key common signal lines intersect the key data signal lines. The key data signal lines are periodically monitored while key scan signal is not output to any of the key common signal lines. Based on the results of monitoring, an earth fault is detected in key common signal lines or key data signal lines.

3 Claims, 5 Drawing Sheets

MATRIX KEY INPUT INTERFACE

RELATED APPLICATIONS

The present application claims priority to Japanese Application Number 2014-060389, filed Mar. 24, 2014, the disclosure of which is hereby incorporated by reference herein in its entirety.

BACKGROUND OF THE INVENTION

Field of the Invention

The present invention relates to a matrix key input interface that enables detection of an earth fault on a key common signal line and a key data signal line.

Description of the Related Art

A key matrix circuit is conventionally known which acquires key information by scanning information on keys each connected to a grid-like wiring pattern on a column-by-column basis. Compared to a configuration in which the keys are connected to the respective wiring patterns on a one-to-one basis, such a key matrix circuit, including the wiring pattern arranged like a grid, enables information on many keys to be detected using a small number of signal lines.

However, if an earth fault occurs in the wirings between the key matrix circuit and a common signal output circuit or a data signal reception circuit (hereinafter referred to as an LSI), an input different from a desired input signal may be detected, leading to a malfunction.

Japanese Patent Application Laid-Open No. 61-58025 discloses a conventional technique relating to a key matrix circuit having a function to detect an abnormality in an input so as to prevent a malfunction of the relevant equipment.

The conventional key matrix circuit includes no mechanism that detects an earth fault in the wirings between the key matrix circuit and the LSI. Thus, when an earth fault occurs in the wirings, an input different from the desired input signal may be detected, leading to a malfunction.

Furthermore, the technique disclosed in Japanese Patent Application Laid-Open No. 61-58025, mentioned above, detects an abnormality in the input to the key matrix circuit but does not detect an earth fault in the wirings between the key matrix circuit and the LSI.

SUMMARY OF THE INVENTION

Thus, an object of the present invention is to provide a matrix key input interface which has a key matrix circuit and enables detection of an earth fault in the wirings between the key matrix circuit and an LSI.

A first aspect of the matrix key input interface according to the present invention has a sink key matrix circuit. The sink key matrix circuit has m (m is a natural number) key common signal lines and n+1 (n is a natural number) key data signal lines wired in a matrix, and m×n key switches connected between the m key common signal lines and a first to an n-th key data signal lines, the key common signal lines intersecting the key data signal lines. A sneak preventing diode is connected between the n+1-th key data signal line and each of the m key common signal lines. The matrix key input interface further has a monitoring unit that periodically monitors all of the n+1 key data signal lines while key scan signal is not output to any of the m key common signal lines, and a detection unit that detects an earth fault when any of the key data signal lines is at an L level while the key data signal lines are being monitored by the monitoring unit.

A second aspect of the matrix key input interface according to the present invention has a source key matrix circuit. The source key matrix circuit has m+1 (m is a natural number) key common signal lines and n+1 (n is a natural number) key data signal lines wired in a matrix, and m×n key switches connected between a first to an m-th key common signal lines and a first to an n-th key data signal lines, the key common signal lines intersecting the key data signal lines. A sneak preventing diode is connected between the n+1-th key data signal line and each of the key common signal lines and between the m+1-th key common signal line and each of the key data signal lines. The matrix key input interface further has a monitoring unit which additionally outputs a key scan signal to the m+1-th key common signal line at a timing other than a timing for output of the key scan signal and which monitors signals output from the n+1-th key data signal line during execution of all key scans including the added key scan signal, and a detection unit that detects an earth fault when the signals from the added n+1-th key data signal lines corresponding to all the key scan signals are at an L level.

A third aspect of the matrix key input interface according to the present invention has a sink key matrix circuit. The sink key matrix circuit has m (m is a natural number) key common signal lines and n (n is a natural number) key data signal lines wired in a matrix, and m×n key switches connected between the key common signal lines and the key data signal lines, the key common signal lines intersecting the key common signal lines. The matrix key input interface further has a monitoring unit that periodically monitors all of the n key data signal lines while key scan signal is not output to any of the m key common signal lines, and a detection unit which detects an earth fault on the key data signal lines in case where any of the key data signal lines is at an L level during monitoring of the key data signal lines when key input has not been performed on the key switches, and which detects an earth fault on the key common signal lines in case where any of the key data signal lines is at the L level during monitoring of the key data signal lines when key input has been performed on the key switches.

According to the invention, it is possible to provide a matrix key input interface which has a key matrix circuit and enables detection of an earth fault in the wirings between the key matrix circuit and the LSI.

BRIEF DESCRIPTION OF THE DRAWINGS

The above-described and other objects and features of the present invention will be apparent from the following description of embodiments with reference to the attached drawings, in which.

DETAILED DESCRIPTION OF THE PREFERRED EMBODIMENTS

First, a first embodiment of a matrix key input interface according to the present invention will be described with reference to FIGS. 1 to 3.

In a key matrix circuit that acquires key information by scanning information on keys each connected to a grid-like wiring pattern on a column-by-column basis, the wiring pattern is arranged like a grid to allow a large amount of key information to be acquired using a reduced number of signal lines. However, when an earth fault occurs in the wirings between the key matrix circuit and an LSI, an input different from a desired input signal may be detected, causing a malfunction.

Figure 1:
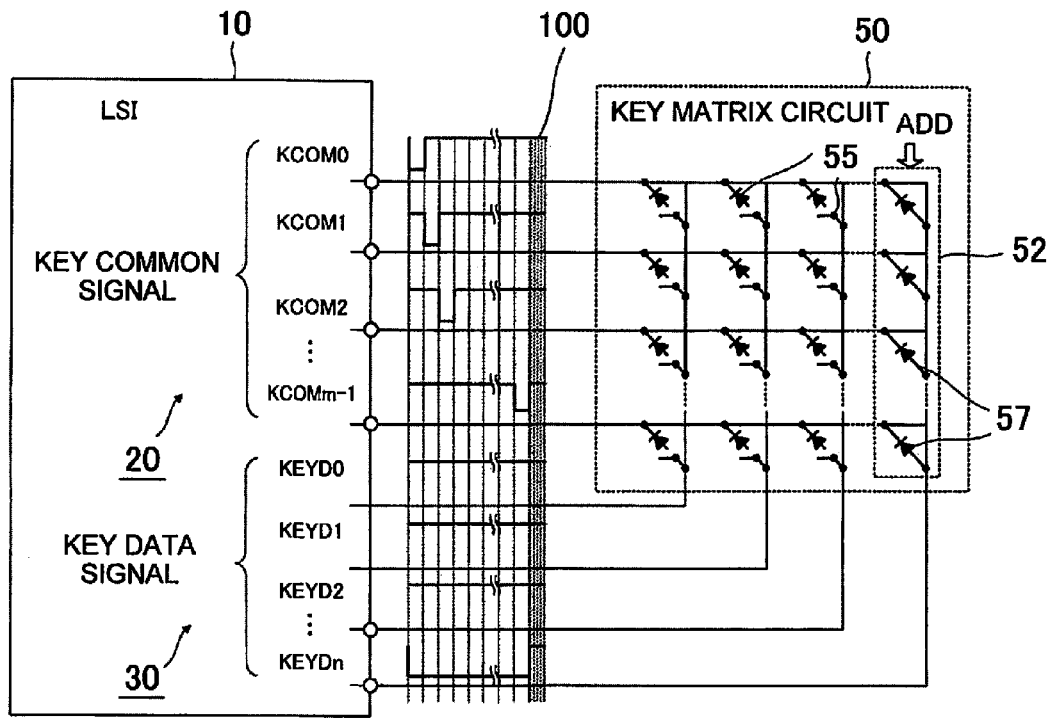
FIG. 1 is a diagram depicting a sink key matrix circuit in a first embodiment of a matrix key input interface according to the present invention.

FIG. 1 is a diagram depicting a sink key matrix circuit that avoids such a malfunction.

In a key matrix circuit 50, m key common signal lines 20 (KCOM0 to KCOMm−1) and n key data signal lines 30 (KEYD0 to KEYDn−1) are arranged so as to intersect one another, and m×n key switches 55 are arranged so as to connect to intersection points between the key common signal lines and the key data signal lines. Each of the key switches 55 is configured to be turned on when a corresponding key is depressed. Furthermore, signals from the key common signal lines 20 and the key data signal lines 30 are input to an LSI 10.

In the present embodiment, in addition to the original m key common signal lines 20 and n key data signal lines 30, an n+1-th key data signal line 52 is installed as an additional key data signal line. A sneak preventing diodes 57 is connected between the added key data signal line 52 and each of the key common signal lines 20 (KCOM0 to KCOMm−1). Unlike other diodes connected as key switches, the sneak preventing diodes 57 are connected so as to constantly remain in an on state.

A key scan is sequentially performed on the key common signal lines 20 starting with KCOM0 as depicted in a time chart in FIG. 1. After the key scan is performed on the m-th KCOMm−1, a state (a shaded portion 100 in the time chart) is established where no key scan is performed on all of the key common signal lines (KCOM0 to KCOMm−1). The circuit is thus set such that, in this state, the key data signal lines (KEYD0 to KEYDn) can be monitored.

The state of the key data signal lines (KEYD0 to KEYDn) is as follows. For KEYD0 to KEYDn−1, the key switch 55 has not been depressed, and thus, these key data signal lines are at an H level during key scans of KCOM0 to KCOMm−1 and the subsequent shaded portion 100. Furthermore, KEYDn is at an L level during key scans of KCOM0 to KCOMm−1 because any of KCOM0 to KCOMm−1 is scanned. However, KEYDn is at the H level in the subsequent shaded portion 100 because key scan is not performed on any of the key common signal lines (KCOM0 to KCOMm−1).

Figure 2:
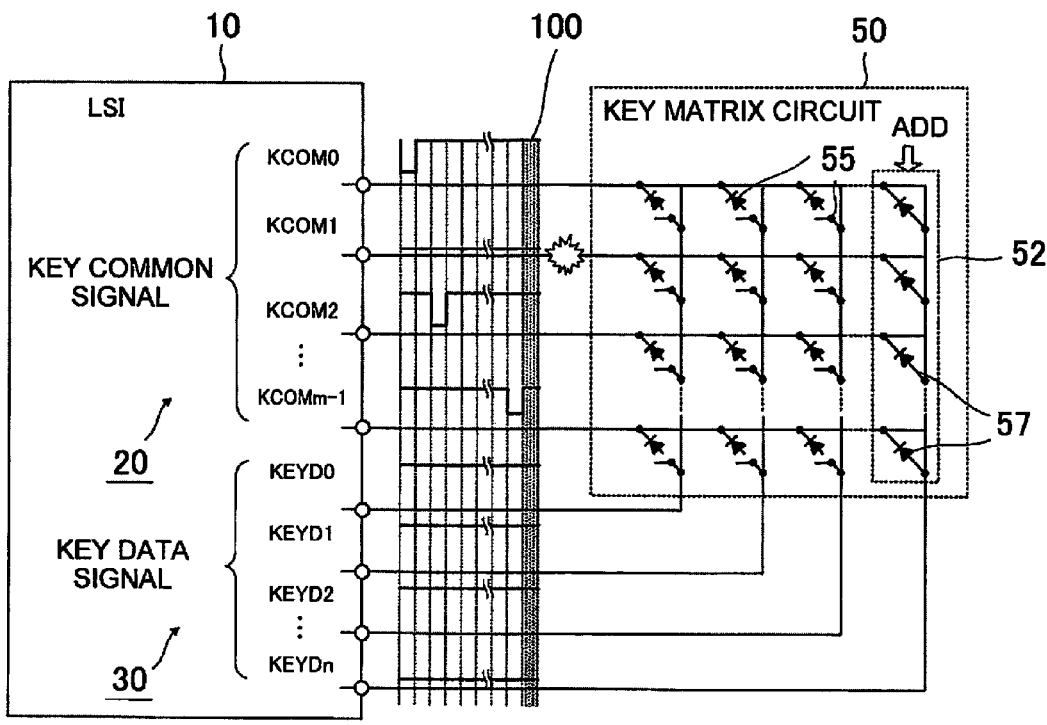
FIG. 2 is a diagram depicting a case where an earth fault occurs on a key common signal line in the sink key matrix circuit in FIG. 1.

FIG. 2 is a diagram depicting a case where an earth fault occurs on KCOM1, one of the key common signal lines 20, in the sink key matrix circuit configured as described above.

In this case, a signal from KCOM1 is constantly at the L level. Since KEYDn and KCOM1 are directly connected with each other via the sneak preventing diodes 57, a signal from KEYDn is constantly at the L level. In the case of FIG. 2, the signal from KEYDn is at the L level even in the shaded portion 100 though the H level is otherwise detected in a state where key scan is not performed on any of the key common signal lines 20, as illustrated by the state of KEYDn in the shaded portion of FIG. 1 described above. Thus, since the L level is detected in KEYDn in the shaded portion 100, occurrence of an earth fault on any of the key common signal lines 20 can be determined.

Figure 3:
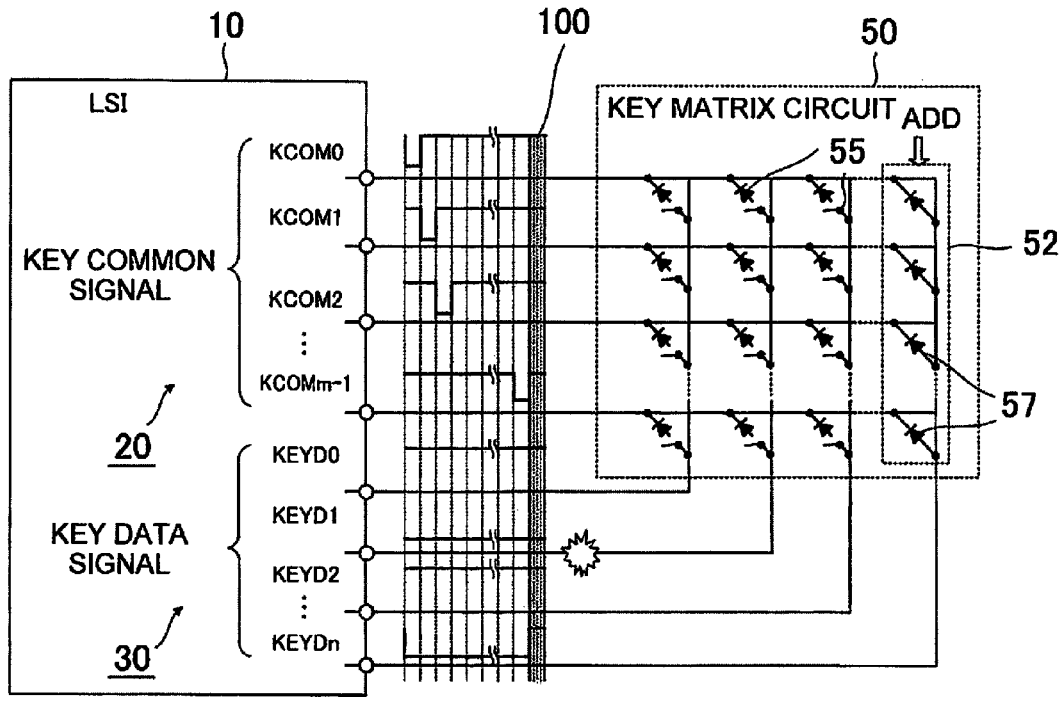
FIG. 3 is a diagram depicting a case where an earth fault occurs on a key data signal line in the sink key matrix circuit in FIG. 1.

FIG. 3 is a diagram depicting a case where an earth fault occurs on KEYD1, one of the key data signal lines 30, in the sink key matrix circuit configured as described above.

In this case, a signal from KEYD1 is constantly at the L level. The H level is otherwise detected in all of the key data signal lines KEYD0 to KEYDn−1 in the shaded portion 100 in FIG. 1 described above because key scan signal is not output to any of the key common signal lines. Thus, since the L level is detected in KEYD1 in the shaded portion 100, occurrence of an earth fault on KEYD1 can be determined.

Now, a second embodiment of the matrix key input interface according to the present invention will be described with reference to FIGS. 4 to 6.

Figure 4:
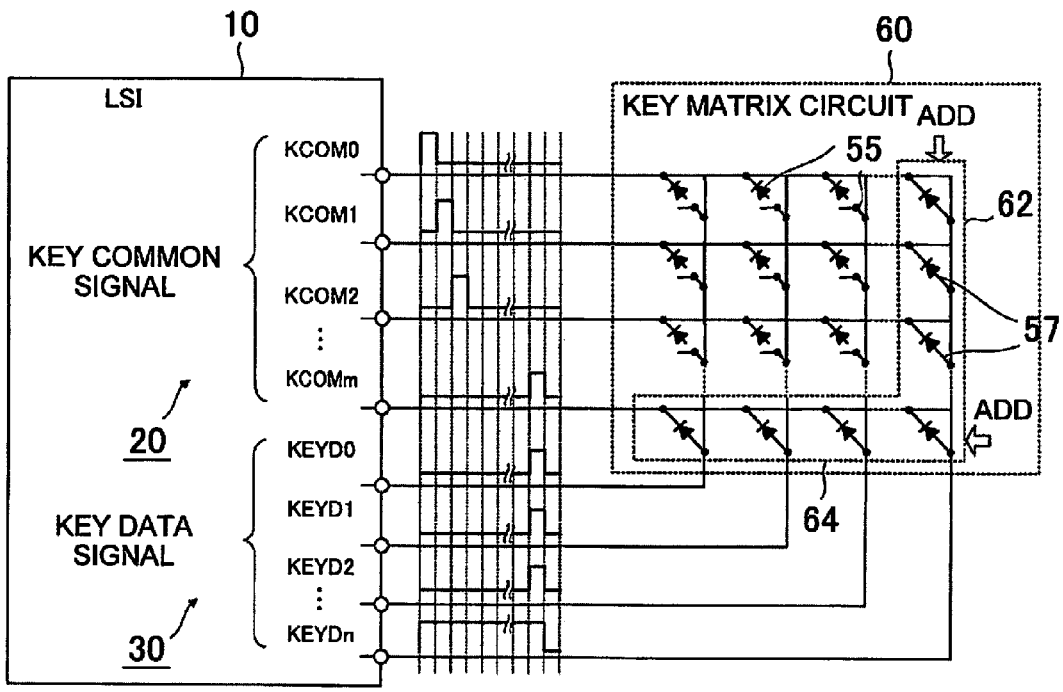
FIG. 4 is a diagram depicting a source key matrix circuit in a second embodiment of the matrix key input interface according to the present invention.

FIG. 4 is a diagram depicting a source key matrix circuit.

In a key matrix circuit 60, m key common signal lines 20 (KCOM0 to KCOMm−1) and n key data signal lines 30 (KEYD0 to KEYDn−1) are arranged so as to intersect one another, and m×n key switches 55 are arranged so as to connect to intersection points between the key common signal lines and the key data signal lines. Each of the key switches 55 is configured to be turned on by depressing a corresponding key. Furthermore, signals from the key common signal lines 20 and the key data signal lines 30 are input to an LSI 10.

In the present embodiment, in addition to the original m key common signal lines 20 and n key data signal lines 30, an m+1-th key common signal line 64 and an n+1-th key data signal line 62 are installed as an additional key common signal line 20 and an additional key data signal line 30. Sneak preventing diodes 57 are connected between the added key common signal line 64 and each of the other key data signal lines and between the added key data signal line 62 and each of the other key common signal lines. Such sneak preventing diodes, unlike other diodes connected as key switches, are connected so as to constantly remain in the on state.

A key scan is sequentially performed on the key common signal lines 20 starting with KCOM0 as depicted in a time chart in FIG. 4. After the key scan is performed on the m-th KCOMm−1, a key scan signal is additionally output to the newly added m+1-th key common signal line 64. The circuit is thus set such that the state of the n+1-th key data signal line 30 KEYDn to be output during execution of key scans, including the added key scan signal, can be monitored.

The state of the key data signal lines 30 (KEYD0 to KEYDn) is as follows. For KEYD0 to KEYDn−1, the key switch 55 has not been depressed, and thus, these key data signal lines 30 are at the L level during key scans of KCOM0 to KCOMm−1. Furthermore, since the m+1-th key common signal line 20 and all the key data signal lines 30 are connected with each other via the sneak preventing diodes 57, KEYD0 to KEYDn−1 are at the H level during the subsequent key scan of the m+1-th key common signal line 20.

The n+1-th key data signal line KEYDn is at the H level during key scans of KCOM0 to KCOMm including the added m+1-th key common signal lines 20.

Figure 5:
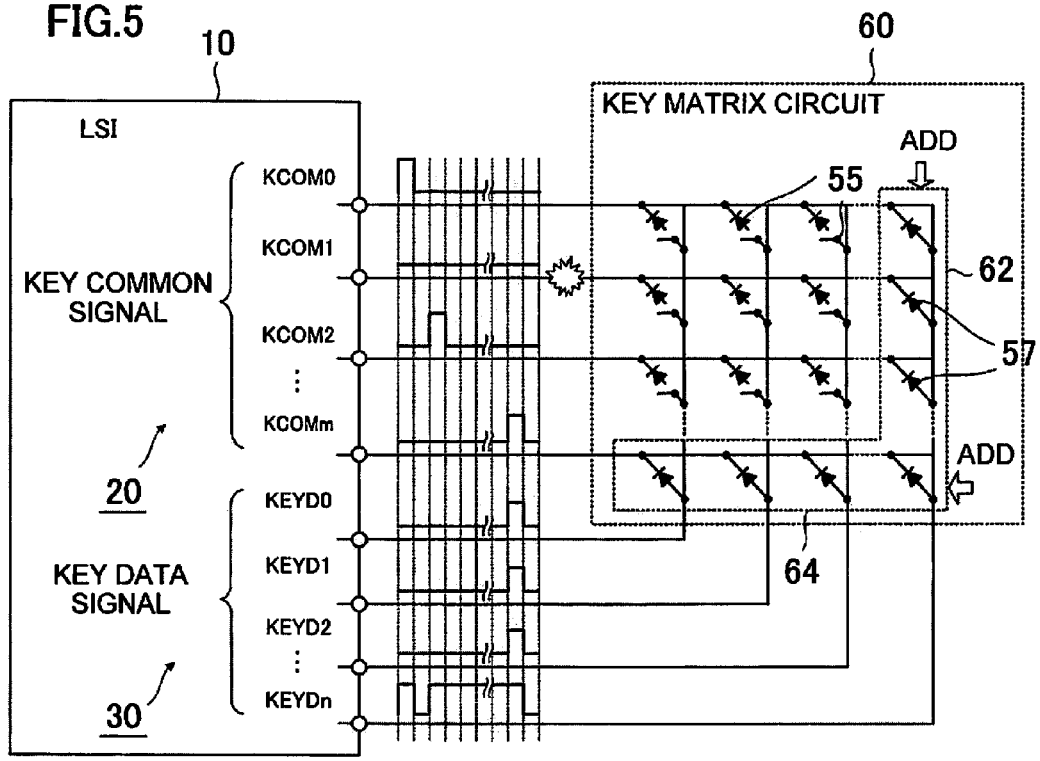
FIG. 5 is a diagram depicting a case where an earth fault occurs on a key common signal line in the source key matrix circuit in FIG. 4.

FIG. 5 is a diagram depicting a case where an earth fault occurs on KCOM1, one of the key common signal lines 20, in the source key matrix circuit configured as described above. In this case, the signal from KCOM1 is constantly at the L level even at timings when a key scan is originally preformed. Since KEYDn and KCOM1 are directly connected with each other via the sneak preventing diodes 57, the signal from KEYDn is at the L level at the timings when the key scan is originally performed on KCOM1.

In the case of FIG. 5, since KEYDn is connected directly to all the key common signal lines 20 via the sneak preventing diodes 57, the L level is detected at the timings when the key scan of KCOM1 is performed though the H level is otherwise detected at all the timings when the key scan of any of the key common signal lines 20 is performed as long as the key scan signal is output normally to each of the key common signal lines 20. Thus, occurrence of an earth fault on KCOM1 can be determined.

Figure 6:
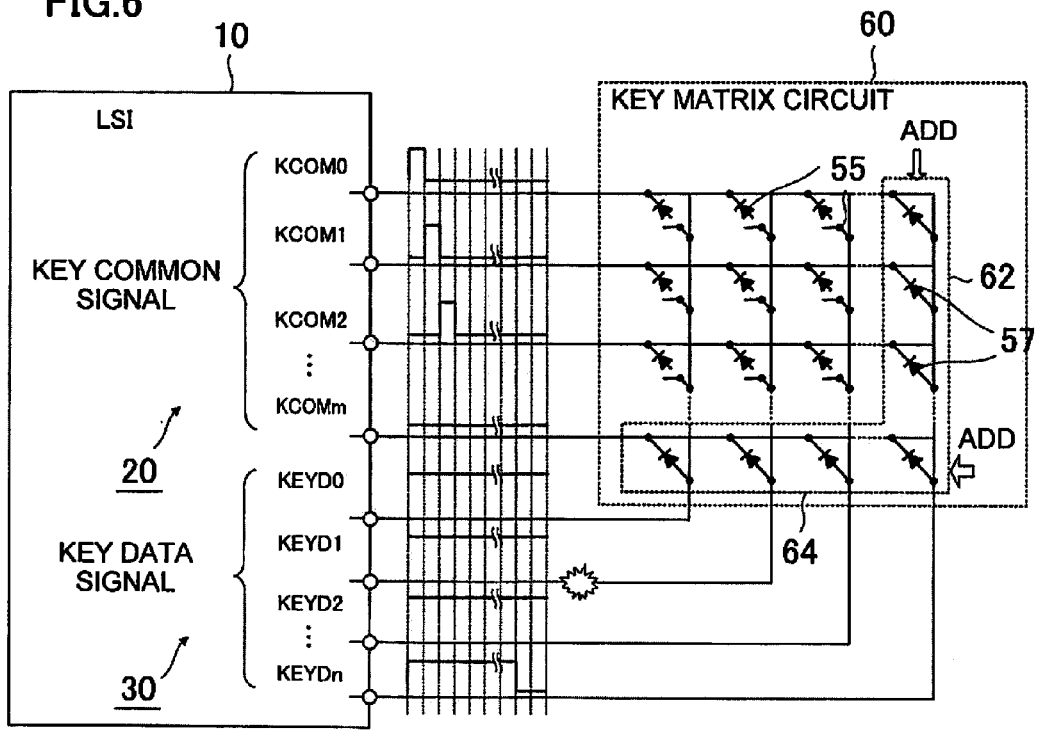
FIG. 6 is a diagram depicting a case where an earth fault occurs on a key data signal line in the source key matrix circuit in FIG. 4.

FIG. 6 is a diagram depicting a case where an earth fault occurs on KEYD1, one of the key data signal lines 30, in the source key matrix circuit configured as described above.

In this case, the signal from KEYD1 is constantly at the L level. As depicted in the time chart in FIG. 6 described above, the H level is otherwise detected in KEYDn at timings corresponding to key scans of KCOMm because, in the normal state, KEYDn is connected directly to KCOMm via sneak preventing diodes. Thus, since the L level is detected in KEYDn at the timings corresponding to the scans of KCOMm, occurrence of an earth fault on any point of the key data signal lines 30 can be determined.

Now, a third embodiment of the matrix key input interface according to the present invention will be described with reference to FIGS. 7 to 9.

Figure 7:
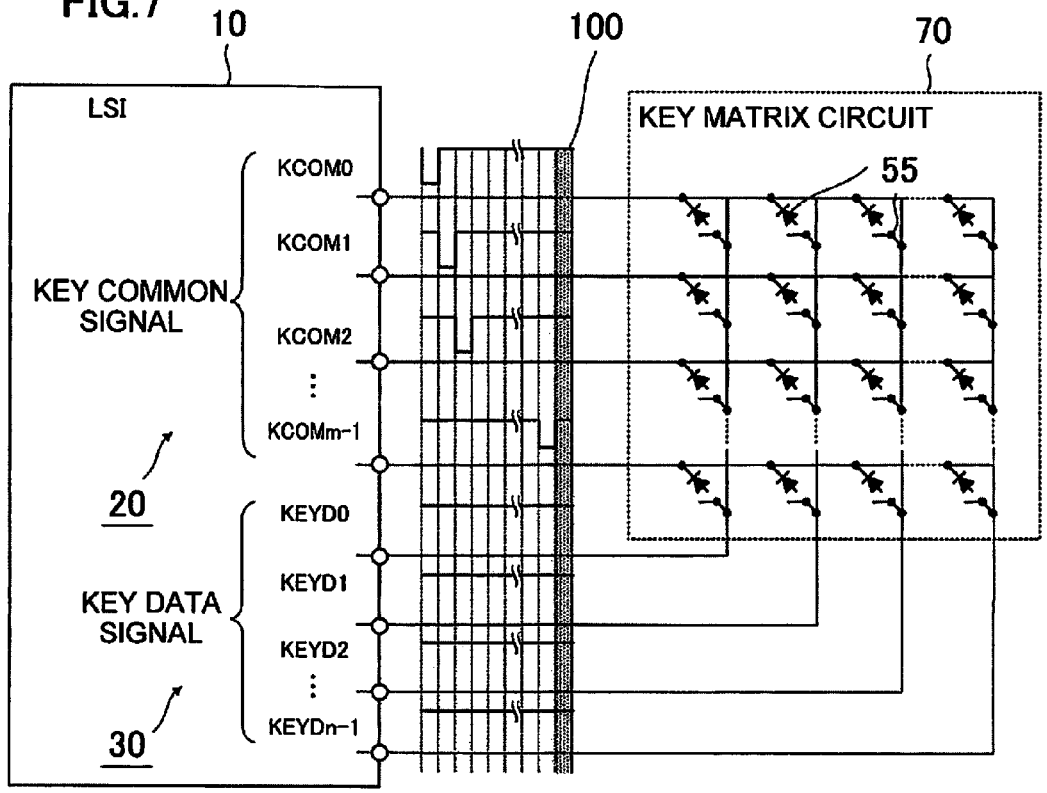
FIG. 7 is a diagram depicting a sink key matrix circuit in a third embodiment of the matrix key input interface according to the present invention.

FIG. 7 is a diagram depicting a sink key matrix circuit.

In a key matrix circuit 70, m key common signal lines 20 (KCOM0 to KCOMm−1) and n key data signal lines 30 (KEYD0 to KEYDn−1) are arranged so as to intersect one another, and m×n key switches 55 are arranged so as to connect to intersection points between the key common signal lines and the key data signal lines. Each of the key switches 55 is configured to be turned on when a corresponding key is depressed. Furthermore, signals from the key common signal lines 20 and the key data signal lines 30 are input to an LSI 10.

A key scan is sequentially performed on the key common signal lines 20 starting with KCOM0 as depicted in a time chart in FIG. 7. After the key scan is performed on the m-th KCOMm−1, a state (a shaded portion 100 in the time chart) is established where key scan is not performed on any of the key common signal lines (KCOM0 to KCOMm−1). The circuit is thus set such that, in this state, the key data signal lines (KEYD0 to KEYDn) can be monitored.

The state of the key data signal lines (KEYD0 to KEYDn−1) is such that the key switch has not been depressed, and thus, the key data signal lines are at the H level during the key scans of KCOM0 to KCOMm−1 and in the subsequent shaded portion.

Figure 8:
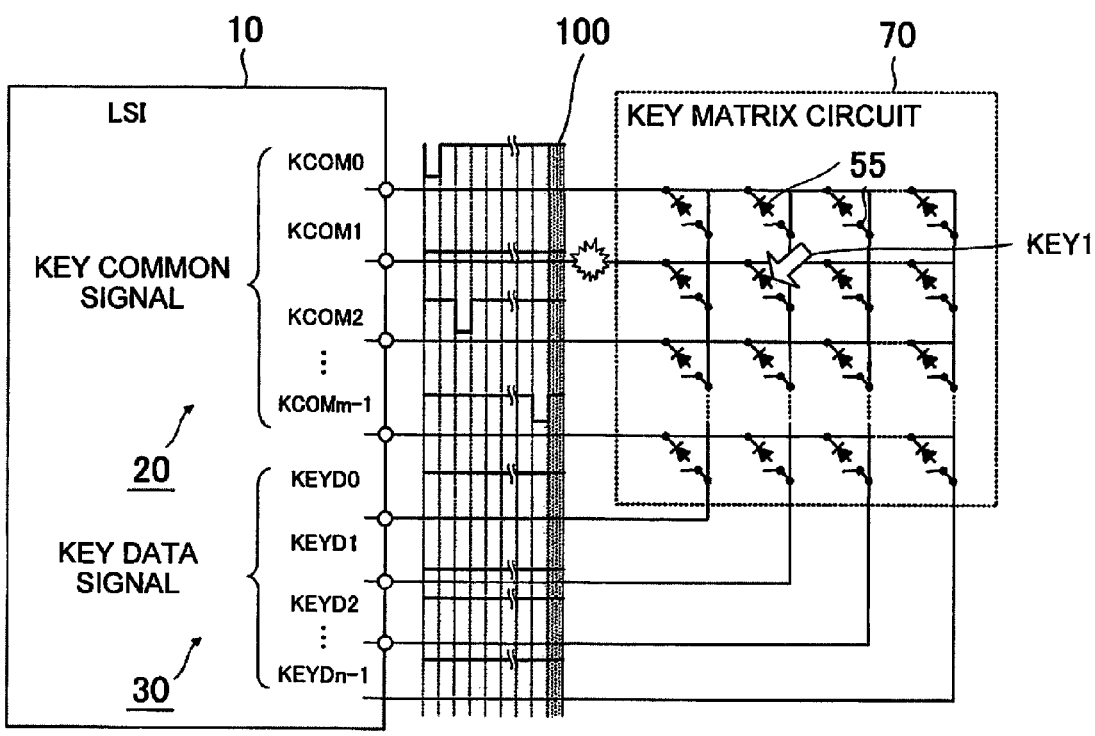
FIG. 8 is a diagram depicting a case where an earth fault occurs on a key common signal line in the sink key matrix circuit in FIG. 7.

FIG. 8 is a diagram depicting a case where an earth fault occurs on KCOM1, one of the key common signal lines 20, in the sink key matrix circuit configured as described above.

In this case, a signal from KCOM1 is constantly at the L level. When the key switch 55 connecting KCOM1 and KEYD1 together is referred to as KEY1, while key input is performed on KEY1, KEYD1 and KCOM1 are at the same potential and at the L level because KEYD1 and KCOM1 are directly connected to each other via KEY1. In the case of FIG. 8, the signal from KEYD1 is at the L level in the shaded portion 100 in FIG. 7 described above though the H level is otherwise detected in all the key data signal lines 30 in the shaded portion because key scan signal is not output to any of the key common signal lines 20. Thus, since the L level is detected in KEYDn at KEYD1 in the shaded portion, occurrence of an earth fault on KCOM1 can be determined.

Figure 9:
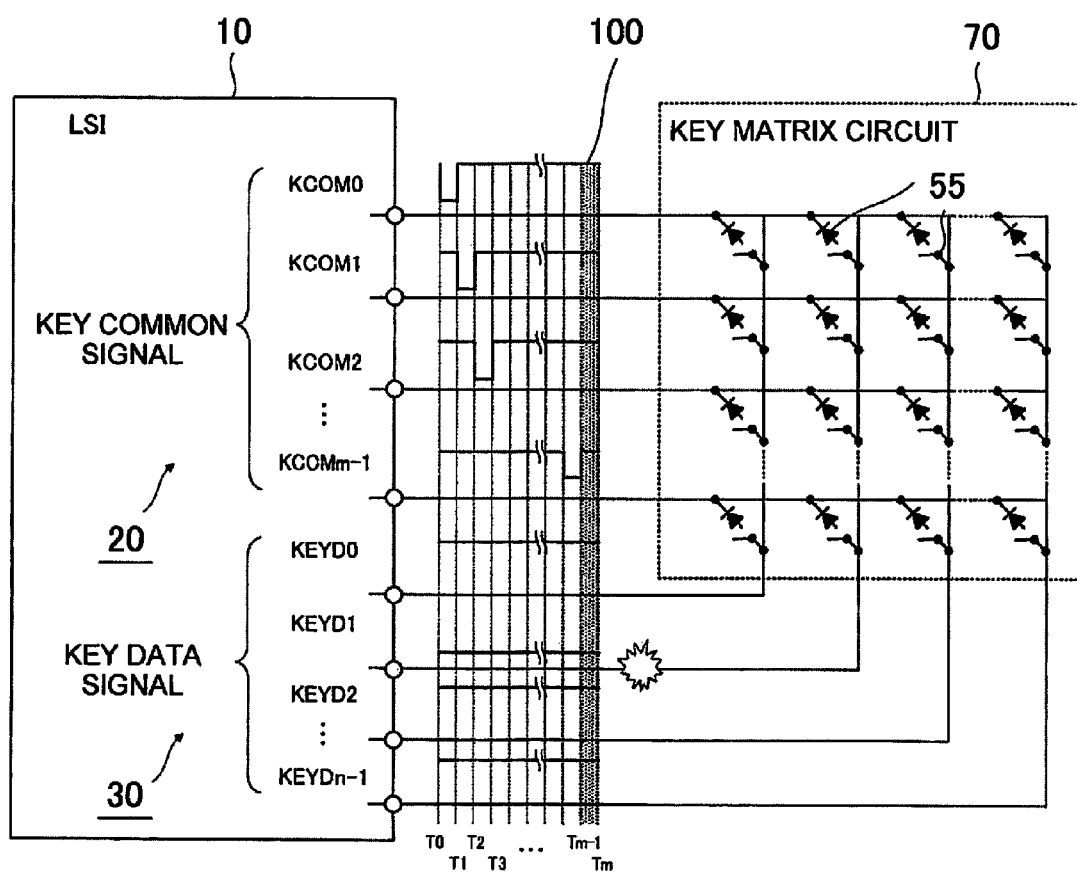
FIG. 9 is a diagram depicting a case where an earth fault occurs on a key data signal line in the sink key matrix circuit in FIG. 7.

FIG. 9 is a diagram depicting a case where an earth fault occurs on KEYD1, one of the key data signal lines 30, in the sink key matrix circuit configured as described above. In this case, a signal from KEYD1 is constantly at the L level. In the shaded portion in FIG. 7 described above, the H level is otherwise detected in all the key data signal lines KEYD0 to KEYDn−1 because key scan signal is not output to any of the key common signal lines. Thus, since the L level is detected in KEYD1 in the shaded portion 100, occurrence of an earth fault on KEYD1 can be determined.

What is claimed is:

1. A matrix key input interface with a sink key matrix circuit, the sink key matrix circuit comprising:
   m (m is a natural number) key common signal lines and n+1 (n is a natural number) key data signal lines wired in a matrix; and
   m×n key switches connected between the m key common signal lines and a first to an n-th key data signal lines, the key common signal lines intersecting the key data signal lines,
   wherein a sneak preventing diode is connected between the n+1-th key data signal line and each of the m key common signal lines,
   the matrix key input interface further comprising:
   a monitoring unit that periodically monitors all of the n+1 key data signal lines while key scan signal is not output to any of the m key common signal lines; and
   a detection unit that detects an earth fault when any of the key data signal lines is at an L level while the key data signal lines are being monitored by the monitoring unit.

2. A matrix key input interface with a source key matrix circuit, the source key matrix circuit comprising:
   m+1 (m is a natural number) key common signal lines and n+1 (n is a natural number) key data signal lines wired in a matrix; and
   m×n key switches connected between a first to an m-th key common signal lines and a first to an n-th key data signal lines, the key common signal lines intersecting the key data signal lines,
   wherein a sneak preventing diode is connected between the n+1-th key data signal line and each of the key common signal lines and between the m+1-th key common signal line and each of the key data signal lines,
   the matrix key input interface further comprising:
   a monitoring unit which additionally outputs a key scan signal to the m+1-th key common signal line at a timing other than a timing for output of the key scan signal and which monitors signals output from the n+1-th key data signal line during execution of all key scans including the added key scan signal; and a detection unit that detects an earth fault when the signals from the added n+1-th key data signal lines corresponding to all the key scan signals are at an L level.

3. A matrix key input interface with a sink key matrix circuit, the sink key matrix circuit comprising:
- m (m is a natural number) key common signal lines and n (n is a natural number) key data signal lines wired in a matrix; and
- m×n key switches connected between the key common signal lines and the key data signal lines, the key common signal lines intersecting the key common signal lines, the matrix key input interface further comprising:
- a monitoring unit that periodically monitors all of the n key data signal lines while key scan signal is not output to any of the m key common signal lines; and
- a detection unit which detects an earth fault on the key data signal lines in case where any of the key data signal lines is at an L level during monitoring of the key data signal lines when key input has not been performed on the key switches, and which detects an earth fault on the key common signal lines in case where any of the key data signal lines is at the L level during monitoring of the key data signal lines when key input has been performed on the key switches.

* * * * *